(12) United States Patent
Yasuyoshi

(10) Patent No.: US 9,508,572 B2
(45) Date of Patent: Nov. 29, 2016

(54) BONDING DEVICE

(71) Applicant: SHIBUYA KOGYO CO., LTD., Kanazawa-shi, Ishikawa (JP)

(72) Inventor: Hiroyuki Yasuyoshi, Kanazawa (JP)

(73) Assignee: SHIBUYA KOGYO CO., LTD., Kanazawa-shi, Ishikawa (JP)

( * ) Notice: Subject to any disclaimer, the term of this patent is extended or adjusted under 35 U.S.C. 154(b) by 283 days.

(21) Appl. No.: 14/288,054

(22) Filed: May 27, 2014

(65) Prior Publication Data

US 2014/0352141 A1    Dec. 4, 2014

(30) Foreign Application Priority Data

May 31, 2013  (JP) .................................. 2013-116133

(51) Int. Cl.
| | |
|---|---|
| B23K 26/22 | (2006.01) |
| H01L 21/67 | (2006.01) |
| H01L 23/00 | (2006.01) |
| B23K 26/06 | (2014.01) |

(52) U.S. Cl.
CPC ......... *H01L 21/67144* (2013.01); *B23K 26/06* (2013.01); *H01L 24/75* (2013.01); *H01L 2224/7501* (2013.01); *H01L 2224/75263* (2013.01); *H01L 2224/75745* (2013.01); *H01L 2224/75824* (2013.01); *Y10T 29/53178* (2015.01)

(58) Field of Classification Search
CPC .............. B23K 26/702; B23K 26/032; B23K 26/0665; B23K 26/0876; B23K 37/0443; B23K 37/047
See application file for complete search history.

(56) References Cited

U.S. PATENT DOCUMENTS

| | | | |
|---|---|---|---|
| 7,126,747 B2* | 10/2006 | Lee .......................... | H01S 3/302 359/334 |
| 8,168,920 B2 | 5/2012 | Terada et al. | |
| 9,162,320 B2* | 10/2015 | Tanaka ................... | B23K 26/22 |
| 2007/0037318 A1* | 2/2007 | Kim .................... | B23K 26/0643 438/106 |
| 2009/0071945 A1* | 3/2009 | Terada ................. | B23K 1/0056 219/121.63 |
| 2014/0001162 A1* | 1/2014 | Tanaka ............... | B23K 26/0066 219/121.6 |
| 2014/0001163 A1* | 1/2014 | Tanaka ................... | B23K 26/22 219/121.63 |
| 2016/0039045 A1* | 2/2016 | Webster ............... | B23K 26/032 356/496 |

FOREIGN PATENT DOCUMENTS

JP        2009-182162 A       8/2009

* cited by examiner

*Primary Examiner* — Minh Trinh
(74) *Attorney, Agent, or Firm* — Muncy, Geissler, Olds & Lower, P.C.

(57) ABSTRACT

A boding device includes a light guiding part that guides laser beam oscillated from a laser oscillator, a bonding head that heats a chip with the laser beam, and a bonding head moving part that moves the bonding head between a supply position and a bonding position. The laser oscillator is separated from the bonding head. The light guiding part includes an irradiation barrel that is provided in the vicinity of the bonding position and, a shutter part that is provided in the irradiation barrel, and a light receiving part that is provided in the bonding head and guides the laser beam to the chip. When the bonding head moving part moves the bonding head to the bonding position, the shutter part is opened so that the laser beam from the irradiation barrel is guided to the bonding head through the light receiving part.

2 Claims, 5 Drawing Sheets

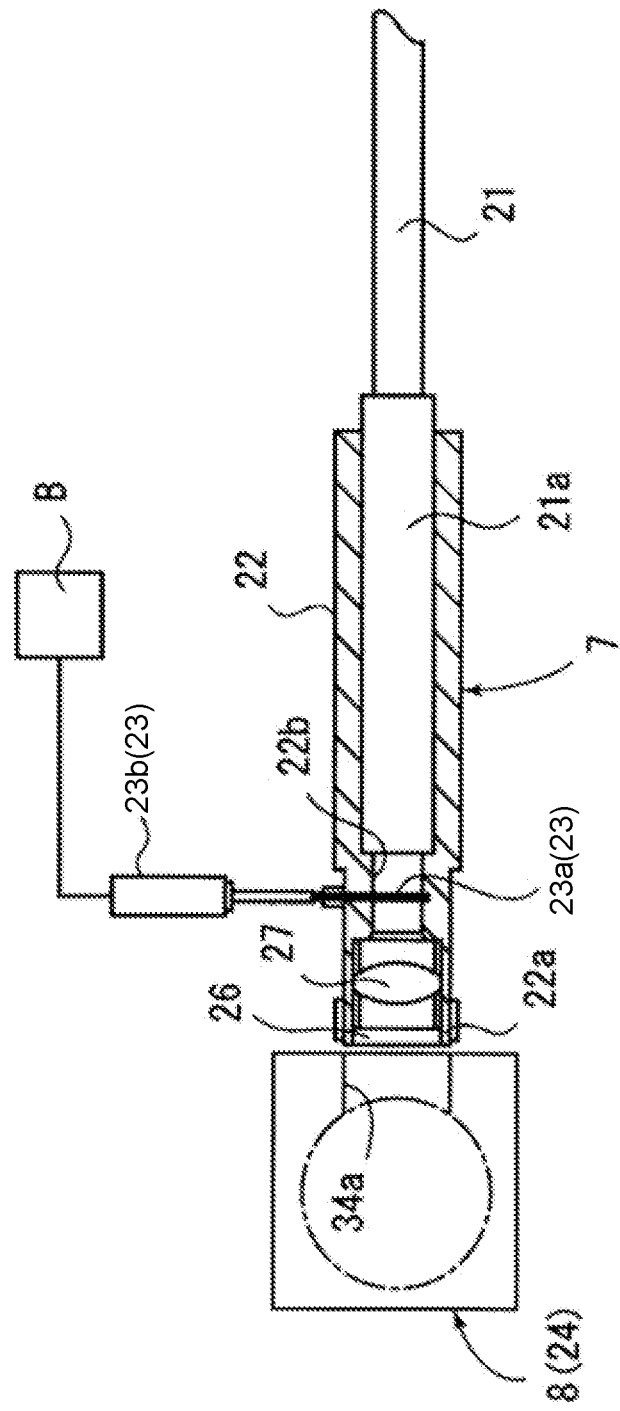

BONDING DEVICE

CROSS REFERENCE

The present application is related to, claims priority from and incorporates by reference Japanese Patent Application No. 2013-116133, filed on May 31, 2013.

TECHNICAL FIELD

The present invention relates to a bonding device, specifically, a bonding device including a bonding head that sucks and holds a chip, also bonds the chip on a substrate by heating the chip with laser beam.

BACKGROUND

Conventionally, devices are known as bonding devices for bonding a chip, which is composed with electronic parts, on a substrate, the devices including a laser oscillator that oscillates laser beam, a light guiding means that guides the laser beam oscillated from the laser oscillator, a bonding head that sucks and holds the chip at a supply position, also heats the chip with the laser beam that the light guiding means guides and bonds the chip on the substrate, and a bonding head moving means that moves the bonding head between the supply position and a bonding position. Also, for those bonding devices, other devices are known in which the laser oscillator is provided in the bonding head and the bonding head is movable together with the laser oscillator, see Patent Doc. 1 below.

PATENT DOCUMENT(S)

Patent Doc. 1: JP Laid-Open Patent Publication 2009-182162

However, like the above patent doc. 1, with a configuration in which the bonding head moves together with the laser oscillator, the unit weight of the bonding head including the laser oscillator becomes large, making it difficult to locate the bonding head at an accurate position. Considering the above matter, the present invention provides a bonding device that is able to move the bonding head with high accuracy.

SUMMARY

A boding device disclosed in the application includes a laser oscillator that oscillates laser beam; a light guiding part that guides the laser beam oscillated from the laser oscillator; a bonding head that sucks and holds a chip at a supply position where the chip is supplied, and that bonds the chip to a substrate by heating the chip with the laser beam guided by the light guiding part at a bonding position where the chip contacts to the substrate; and a bonding head moving part that moves the bonding head between the supply position and the bonding position. Wherein, the laser oscillator is separated from the bonding head, the light guiding part is configured with an irradiation barrel that is provided in the vicinity of the bonding position and irradiates the laser beam oscillated from the laser oscillator from an irradiation opening disposed at a front end thereof, a shutter part that is provided in the irradiation barrel and openably and closably configured to intercept the laser beam, a light receiving part that is provided in the bonding head, comprises an opening part that is an opening facing the irradiation barrel, and guides the laser beam entered from the opening part to the chip, when the bonding head moving part moves the bonding head to the bonding position, one of the irradiation opening of the irradiation barrel and the opening part of the light receiving part approaches the other in order to become close, the shutter part is opened at the status so that the laser beam from the irradiation barrel is guided to the bonding head through the opening part of the light receiving part.

According to the above configuration, the laser oscillator is provided as a different part which is separated from the bonding head, and the bonding head is positioned at the bonding position. Thereby, the irradiation barrel, which configures the light guiding part, and the light receiving part become close so that the laser beam oscillated from the laser oscillator is configured to be irradiated on the chip through the light receiving part. Namely, because it is not necessary to provide the laser oscillator with the bonding head, a weight reduction of the bonding head is realized, and the bonding head is able to move with high speed and high accuracy. On the other hand, when the bonding head is positioned at the bonding position, by opening the shutter part, the irradiation of the laser beam from the irradiation barrel is allowed. Thereby, when the bonding head is positioned at any position other than the bonding position, the laser beam does not leak outside from the irradiation barrel, securing the operator's safety.

BRIEF DESCRIPTIONS OF THE DRAWINGS

FIG. 5 is a plan view illustrating the bonding head and the light guiding part.

DETAILED DESCRIPTIONS OF EMBODIMENTS

Figure 1:
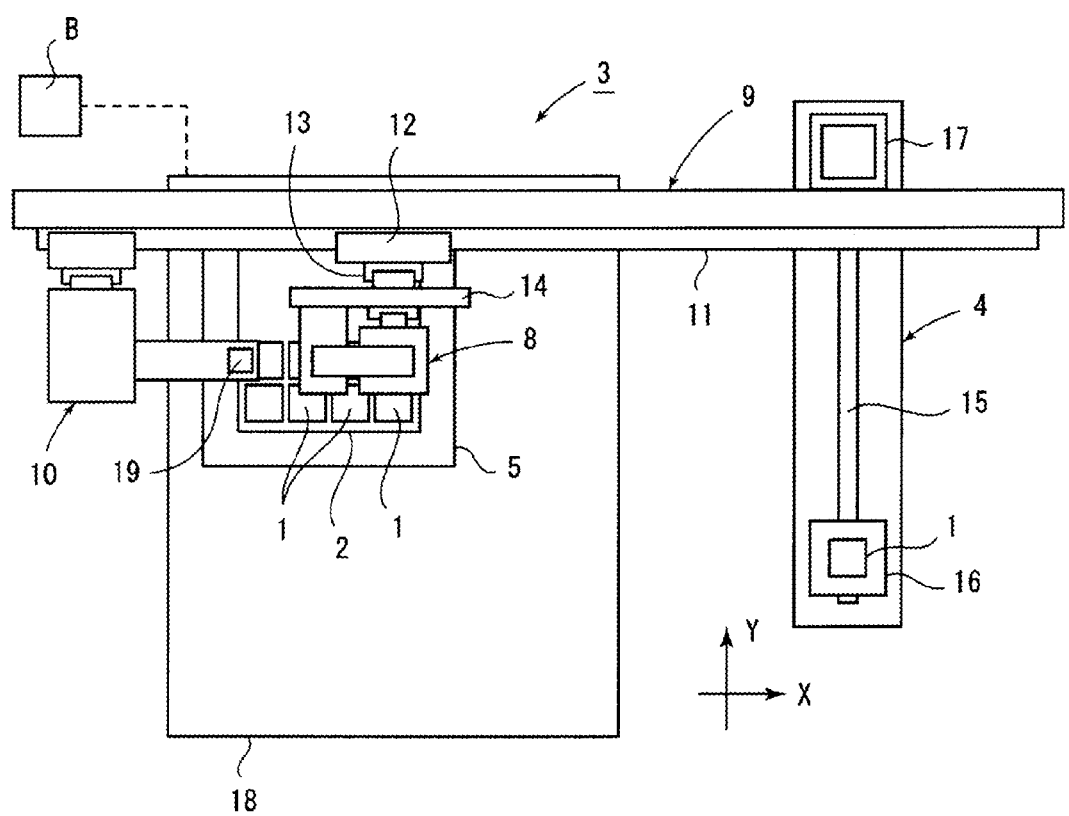
FIG. 1 is a plan view of a bonding device of an embodiment.
Figure 2:
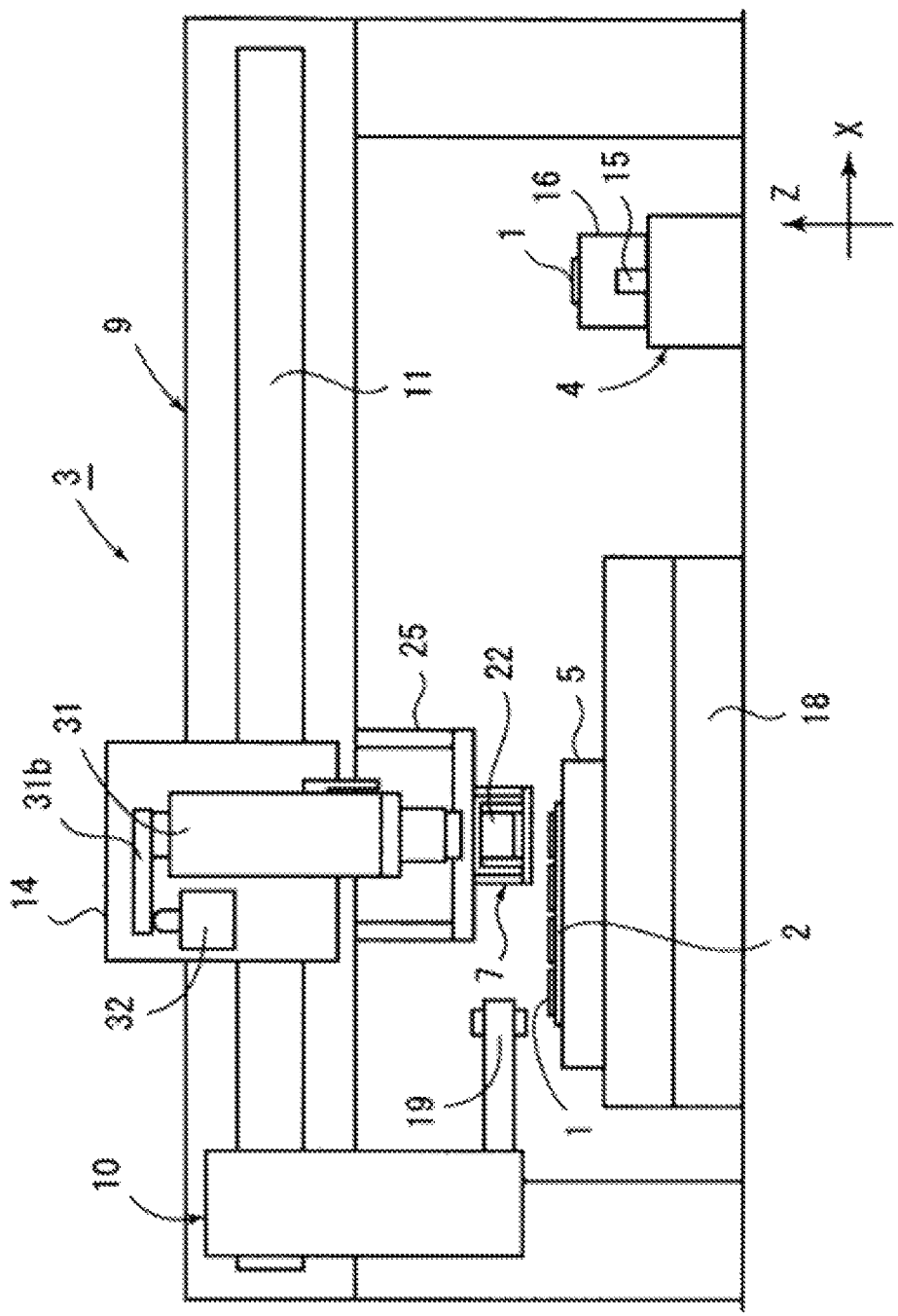
FIG. 2 is a front view of the bonding device.
Figure 3:
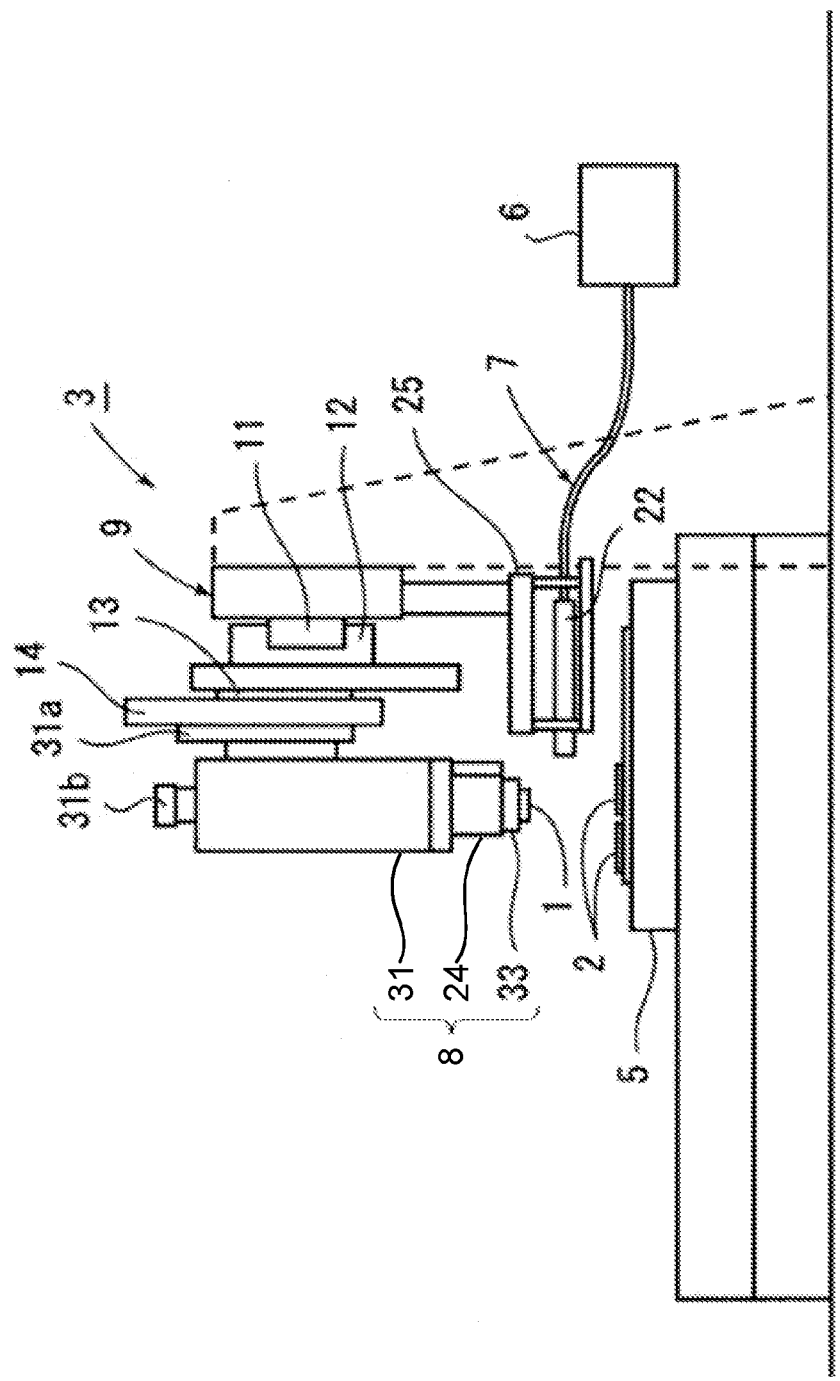
FIG. 3 is a side view of the bonding device.

Hereinafter, an embodiment(s) is explained. FIGS. 1-3 illustrates a bonding device 3 for bonding a chip, which is composed with electronic parts, on a surface of a substrate 2 such as an electronic circuit or semiconductor substrate (wafer) or the like. The bonding device 3 is configured to mount the chip 1 on the substrate 2 by heat fixing a bump formed on a lower surface of the chip 1 in a state where the chip 1 is pressed to the substrate 2 at a required position. The bonding device includes a chip supply part 4 that supplies the chip 1, a bonding stage 5 that supports the substrate 2, a laser oscillator 6 that oscillates laser beam L (see FIG. 3), a light guiding part 7 that guides the laser beam L oscillated from the laser oscillator 6, a bonding head 8 that sucks and holds the chip 1 also bonds the chip 1 on the substrate 2 with the laser beam L, a bonding head moving part 9 that moves the bonding head 8, an imaging means 10 that images the chip 1 and substrate 2. These parts (or components of the bonding device) are controlled by a control part B. FIG. 1 is a plan view of the bonding device 3, FIG. 2 is a front view, FIG. 3 is a side view respectively thereof. In the following explanations, the right-left direction shown in FIG. 1 is referred to X direction, the up-down direction thereof is to Y direction. The up-down direction in FIG. 3 is referred to Z direction.

Firstly, the bonding head moving part 9 is explained, which is configured to move the bonding head 8. The bonding head moving part 9 is configured with an X direction rail 11, an X direction slider 12, a Z direction rail 13 and a Z direction slider 14. The X direction rail 11 is arranged in the X direction. The X direction slider 12 moves along the X direction rail 11. The Z direction rail 13 is arranged on the X direction slider 12. The Z direction slider 14 moves upward/downward (or ascends/descends) along the Z direction rail 13, also holds the bonding head 8. The X direction slider 12 and Z direction slider 14 are configured to be driven by a driving part(s) (not shown in the drawings). Hereinafter, a position where the bonding head 8 receives the chip 1 from the chip supply part 4 is referred to a supply position. Another position where the chip 1 is bonded to the substrate 2 on the bonding stage 5 is referred to a bonding position. Further, the bonding head 8 is positioned upward with respect to the bonding position. When bonded, the chip 1 descends in the Z direction from the state (or the bonding position) and is expected to contact to the substrate 2.

The chip supply part 4 is configured with a Y direction rail 15 that is arranged in the Y direction, a relay stage 16 that is provided movable along the Y direction rail 15 and that supports the chip 1, and a flux apply stage 17 that contains flux. The Y direction rail 15 is provided crossing the X direction rail 11 of the bonding head moving part 9. Normally, the relay stage 16 is positioned at a waiting position where is shown at a lower end of the Y direction rail 15. The flux apply stage 17 is positioned at another waiting position where is shown at an upper end. Also, the relay stage 16 and flux apply stage 17 are configured to be driven by a driving part(s) (not shown in the drawings), along the Y direction rail 15, and to move up to the supply position which is an intersection with a moving path of the bonding head 8 movable along the X direction rail 11.

The bonding stage 5 is configured to suck and hold the substrate 2 at its upper surface. Below the bonding stage 5, an X-Y table 18 is arranged, which moves the bonding stage 5 in the X direction and the Y direction. Herein, the bonding head 8 is configured to descend to a bonding position determined by the bonding head moving part 9. Contrary to that, the bonding stage 5 is moved by the X-Y table 18, and is configured to match the required position of the substrate 2 mounted on the bonding stage 5 with a position of the chip 1 that is sucked and held to the bonding head 8.

The imaging means 10 is configured movable along the X direction rail 11 by driving part (not shown in the drawings), is usually positioned at a waiting position that is at a left end shown in FIG. 1. The imaging means 10 includes a camera 19 that is able to simultaneously image upward and downward. The camera 19, as shown in FIG. 2, is provided at a height to be inserted between the chip 1 that is sucked and held by the bonding head 8 and the substrate 2 that is placed on the bonding stage 5. When the bonding head 8 moves up to the upper side of the bonding stage 5, the camera 19 moves from the waiting position, images a lower surface of the chip 1 and an upper surface of the substrate 2. According to the photographic result, the X-Y table 18 moves the bonding stage 5 so that an alignment between the chip 1 and the substrate 2 is performed.

Next, the laser oscillator 6 and the light guiding part 7 that guides laser beam oscillated from the laser oscillator 6 are explained. Initially, the laser oscillator 6 is a semiconductor laser oscillator that is another device, as shown in FIG. 3, separated (or different) from the bonding head 8, and is configured to irradiate a near infrared ray of which the frequency is approximately 900 nm. Then, the laser beam L is guided into the inside of the bonding head 8 by the light guiding part 7, heats the chip 1 that is sucked and held on the bonding head 8. Additionally, because there are risks of losing eyesight when the light directly enters an eye, it is necessary to prevent the laser beam from leaking outside.

Figure 4:
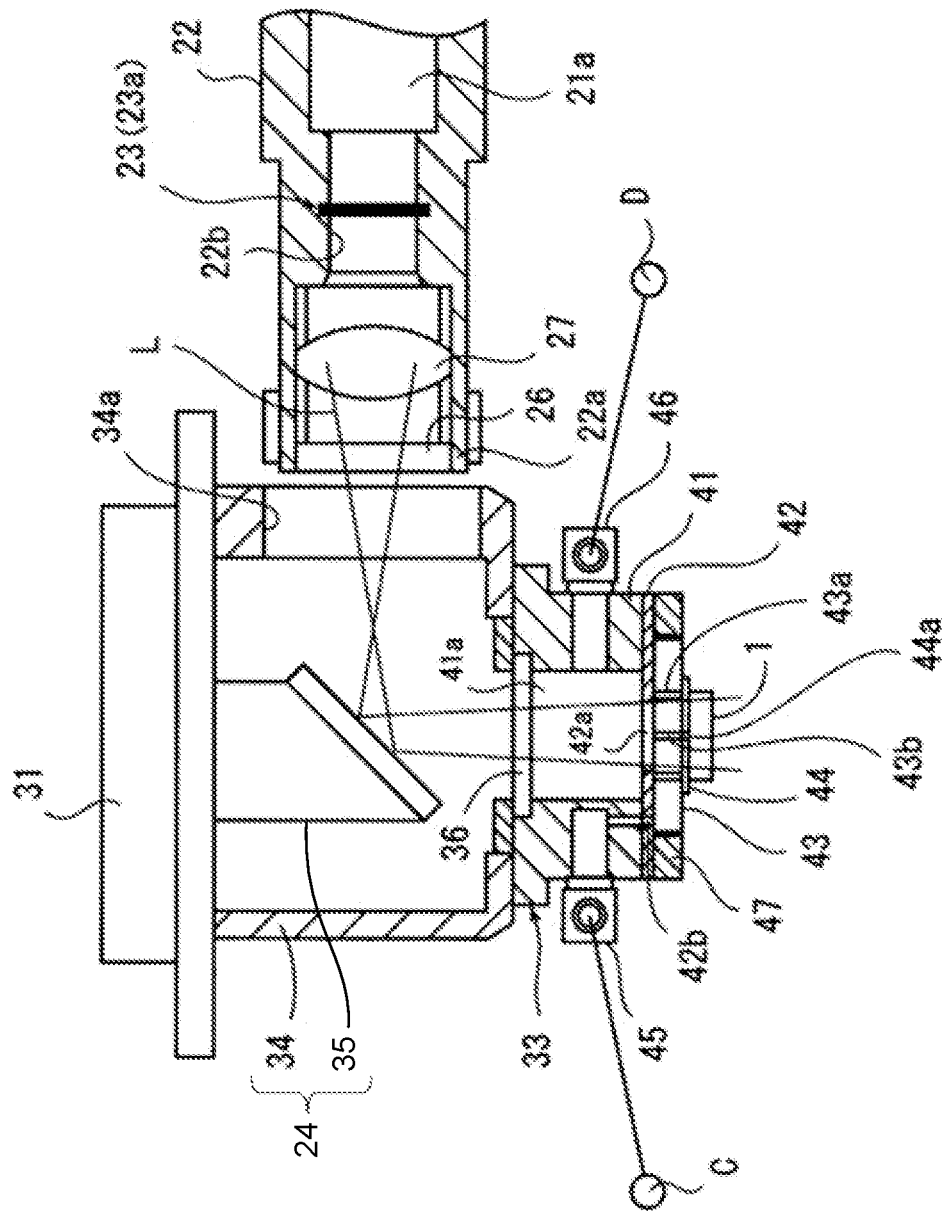
FIG. 4 is a sectional view illustrating a bonding head and a light guiding part.

As illustrated in FIG. 4, the light guiding part 7 is configured with an optical fiber 21 that is connected to the laser oscillator 6, an irradiation barrel 22 that accommodates a front part of the optical fiber 21 and irradiates laser beam L from an irradiation opening 22a that is a front end thereof, a shutter part 23 that is provided in the irradiation barrel 22 and intercepts the laser beam L, and a light receiving part 24 that is provided in the bonding head 8 and guides the laser beam L, which is irradiated from the irradiation barrel 22, to the chip 1. The optical fiber 21 has flexibility and is covered with a cover made of resin (not shown in the drawings). A holder 21a (see FIG. 5) having a cylindrical shape is installed at its front end. The irradiation barrel 22 is a cylindrical member and is held with a holding member 25 (see FIGS. 2 and 3) that is provided below the X direction rail 11 regarding the bonding head moving part 9. The holder 21a of the optical fiber 21 is inserted into a rear end of the irradiation barrel 22. The irradiation barrel 22 is configured to irradiate the laser beam L from the optical fiber 21 toward the Y direction in a horizontal manner. Further, a glass plate 26 is installed in the irradiate aperture 22a of the irradiation barrel 22. A condensing light lens 27 is provided at the rearward of the glass plate 26. By condensing the laser beam L from the optical fiber 21, a focal point is formed at the frontward of the irradiation opening 22a.

The shutter part 23 is configured with a shutter plate 23a that opens or closes a pathway 22b formed inside the irradiation barrel 22 and a drive part 23b that is controlled by the control part B and drives the shutter plate 23a. As illustrated in FIG. 5, the shutter plate 23a is provided between the holder 21a of the optical fiber 21 and the condensing light lens 27, and is able to be inserted into/extracted from a slit formed such that the slit penetrates a side surface of the irradiation barrel 22. In the embodiment, the drive part 23b is an air cylinder fixed to the irradiation barrel 22. A control by the control part B causes the shutter plate 23a to move along the slit, making the pathway 22b of the irradiation barrel 22 open or close. When the shutter part 23 is in a close state, the pathway 22b of the irradiation barrel 22 becomes shut down. Even when the laser beam L is irradiated from the optical fiber 21, the laser beam is intercepted (or blocked), preventing the laser beam L from leaking from the irradiation opening 22a.

The bonding head 8 includes a body part 31 that is movable in the Z direction with respect to the Z direction slider 14 of the bonding head moving part 9, a load cell 32 that is fixed to the Z direction slider 14, a light receiving part 24 that is provided at a lower end of the body part 31 and that configures the light guiding part 7 (see FIG. 4), and a suck part 33 for sucking the chip 1 (see FIG. 4). The body part 31 is configured to be movable in the Z direction by a slider mechanism 31a provided in the Z direction slider 14. The hanger arm 31a is provided in an upper part of the body part 31. By contacting the hanger arm 31b with load cell 32 from a top thereof, loads caused by the body part 31, light receiving part 24 and suck part 33 are applied to the load cell 32. The load cell 32 measures those loads of the body part 31, light receiving part 24 and suck part 33. Thereby, when the bonding head 8 descends and the chip 1 contacts to the substrate 2, the load that is applied to the substrate 2 is to be calculated. Specifically, when the bonding head 8 descends together with the Z direction slider 14 and the chip 1 contacts to the substrate 2, the Z direction slider 14 continues to descend but the bonding head 8 is restricted from further descending by the substrate 2. As the result, the load cell 32 and substrate 32 receive the load of the bonding head 8. For example, in a case where the own weight is 30N, assuming that the measured value of the load cell 32 is 25N, 5N that is the difference is expected to be applied to the substrate 2.

Illustrated in FIG. 4, the light receiving part 24, which configures the light guiding part 7, is configured with mirror casing 34 that is fixed at the lower surface of the body part 31 and a reflection mirror 35 that is provided inside the mirror casing 34. The mirror casing 34 includes an opening part 34a that opens rightward in the figure, namely toward the irradiation barrel 22. When the bonding head 8 is positioned at the bonding position, the irradiation opening 22a of the irradiation barrel 22 is positioned in the vicinity of the opening part 34a. At the lower surface of the mirror casing 34, a penetration hole is formed toward the suck part 33, the penetration hole is closed with a transparent glass plate 36 maintaining an airtight status. The reflection mirror 35 reflects downwardly laser beam L that is irradiated horizontally from the irradiation barrel 22 through the opening part 34a, guides the laser beam L to the suck part 33 through glass plate 36. The angle of the reflection mirror 35 is adjustable by an adjustment means that is provided in the mirror casing 34 (not shown in the drawings).

The suck part 33 is configured with a tool casing 41 that is fixed at a lower surface of the mirror casing 34, a mask 42 that is provided at a lower surface of the tool casing 41, a tool base 43 that is provided at a lower surface of the mask 42, and a tool 44 that is sucked and held at a lower surface of the tool base 43 and that sucks and holds the chip 1. At the tool casing 41, a penetration hole penetrating up and down is formed. The top of the penetration hole is closed by the glass plate 36 that is provided at the lower surface of the mirror casing 34. The bottom of the penetration hole is closed by the tool base 43. With the structure, a space 41a is formed inside the tool casing 41. At the tool casing 41, a tool suck port 45 and a chip suck port 46 are provided. The tool suck port 45 is for sucking a tool and is connected to a vacuum source C. The suck port 46 is for sucking a chip and is connected to a vacuum source D. The tool suck port 45 communicates with the lower surface of the tool casing 41. The chip suck port 46 communicates with the space 41a of the tool casing 41. The mask 42 is in a thin plate shape having one opening part 42a formed at the center. The opening part 42a is formed in accordance with a size of chip 1 that is sucked and held by the tool 44. At the mask 42, another penetration hole 42b that communicates with the tool suck port 45 of the tool casing 41 is formed. At the lower surface of the mask 42, a communication ditch (not shown in the drawings) that communicates with the penetration hole 42b is formed. Accordingly, the tool base 43 that is provided at the lower surface of mask 42 is configured to be sucked and held through the tool suck port 45.

The tool base 43 is in a plate shape made of material through which the laser beam L passes, for example quartz. The tool base 43 is held by a ring shape member 47 that is fixed at the lower surface of the tool casing 41. In the tool base 43, the tool penetration hole 43a for sucking a tool and chip penetration hole 43b for sucking a chip that penetrate up and down are formed. The tool penetration hole 43a is formed at outer side than the opening part 42a of the mask 42. The tool penetration hole 43a is formed outward than the opening part 42a and at a position at which the tool penetration hole 43a communicates with the communication ditch formed at the lower surface of the mask 42. With the structure, the tool penetration hole 43a communicates with the tool suck port 45 and is sucked so that the tool penetration hole 43a sucks and holds the tool 44 at the lower surface of the tool base 43. On the other hand, the chip penetration hole 43b is formed inward than the opening part 42a of the mask 42, is configured to communicate with the vacuum source D through the space 41a of the tool casing 41 and the chip suck port 46.

The tool 44 is a very thin material made of silicon carbide (SiC). As described above, by being sucked through the tool suck port 45, the tool 44 is sucked and held at the lower surface of the tool base 43. Also, a chip suck hole 44a is formed in the tool 44 in correspondence with the chip penetration hole 43b of the tool base 43. By causing the chip suck port 46 to communicate with the lower surface of the tool 44, the chip 1 is configured to be sucked and held. And, the tool suck port 45 communicates with the vacuum source C all the time, preventing the tool 44 from falling off the tool base 43. On the other hand, the chip suck port 46 is configured to communicate with the vacuum source D when sucking and holding the chip 1.

The operations of the bonding device 3 having the above structure are explained. First, in the chip supply part 4, a chip supply device (not shown in the drawings) mounts one chip 1 on the relay stage 16 that is positioned at the waiting position. Then, the relay stage 16 on which the chip 1 is mounted moves to the supply position. Next, the bonding head 8 moves up to an upper side of the supply position by the bonding head moving part 9. After that, the bonding head 8 descends in order to suck and hold the chip 1 at the relay stage 16. Specifically, by communicating with the vacuum source D through the chip suck port 46 of the suck part 33 provided in the bonding head 8, the chip penetration hole 43b of the tool base 43 and the chip suck hole 44a of the tool 44 are sucked. Thereby, the chip 1 is sucked and held on the lower surface of the tool 44. After that, as sucking and holding the chip 1, the bonding head 8 ascends once. The flux apply stage 17 instead of the relay stage 16 moves to the supply position. Then, the bonding head 8 again descends, a flux of the flux apply stage 17 is to be attached to a bump formed at the lower surface of the chip 1.

On the other hand, a substrate supply part (not shown in the drawings) supplies the substrate 2. The X-Y table 18 moves the substrate 2 to the bonding position where the bonding is performed. Then, the bonding head 8 that holds the chip 1 on which the flux is coated moves up to the upper side of the bonding stage 5 by the bonding head moving part 9. Thereby, the imaging means 10 moves the X direction rail 11, takes the camera 19 at a position between the bonding head 8 and the substrate 2. Based on the photographic results, the X-Y table 18 moves the bonding stage 5 in the X-Y directions so that the chip 1 and the substrate 2 are aligned.

After the alignment of the chip 1 and the substrate 2 is completed, the bonding head descends in order to be at a position where the chip 1 contacts to the substrate 2. Further, while measured by the load cell 32, a required load is applied to the substrate 2. Accordingly, when the bonding head 8 is positioned at the bonding position, the opening part 34a, which is formed at the mirror casing 34 of the light receiving part 24 provided in the bonding head 8, and the irradiation opening 22a of the irradiation barrel 22 in the light guiding part 7 face each other at close positions. At that moment, the shutter part 23 in the irradiation barrel 22 is closed. However, when the bonding head 8 comes to the bonding position and the opening part 34a of the light receiving part 24 and the irradiation opening 22a of the irradiation barrel 22 respectively approach to be close (or adjacent), the control device B operates the shutter part 23 and opens the path 22b of the irradiation barrel 22, further irradiates the laser beam L with the laser oscillator 6. Then, following that the laser beam L is guided to the optical fiber 21, the laser beam L passes through the condensing light lens 27 inside the irradiation barrel 22. By the condensing light lens 27, the laser beam L is condensed inside the light receiving part 24 of the bonding head 8. Accordingly, by condensing the laser beam L with the condensing light lens 27, even when a small gap is created between the opening part 34a of the light receiving part 24 and the irradiation opening 22a of the irradiation barrel 22, the laser beam L is prevented from leaking outside from the gap.

The laser beam L condensed inside the light receiving part 24 is reflected in the reflection mirror 35 and guided to the suck part 33. The laser beam L entered to the suck part 33 is formed into a predetermined range by the opening part 42a that is formed at the mask 42. Next, after the laser beam L passes through the tool base 43, the laser beam L irradiates the tool 44 to heat the tool 44 so that the chip 1, which is sucked and held at the tool 44, is heated by the heat transmission. Thereafter, the bump formed on the chip 1 is melted. When the laser oscillator 6 stops the irradiation of the laser beam L after a predetermined period lapses, the bump is cooled and solidified again. Thereby, the chip 1 is fixed to the substrate 2.

Next, the control part stops emitting the laser beam L from the laser oscillator 6 and closes the path 22b of the irradiation barrel 22 by the shutter part 23. The shutter part 23 is configured to maintain the closed status while the bonding head 8 travels any positions other than the bonding position. Even if the laser beam L is irradiated (or emitted), the laser beam L is prevented from leaking outside so that the safety of the operator is secured. Furthermore, the control part is configured to irradiate (or emit) the laser beam L from the laser oscillator 6 only where the bonding head 8 is positioned at the bonding position. Thereby, the operator's safety is more securely realized. When the shutter part 23 is closed, the bonding head 8 ascends by the bonding head moving part 9 in order to suck and held the next chip 1, further moving to the supply position and the above operations are repeated.

According to the above embodiment(s), because the laser oscillator 6 is separated from the bonding head 8 and provided as a different component, the weight reduction of the bonding head 8 is achieved. Thereby, it is realized to move the bonding head 8 with high speed and high accuracy. Also, as discussed above, the laser beam L irradiated from the laser oscillator 6 is so hazardous that it is likely to lose eye sight of the operator if the laser beam L directly comes into the eye. However, in the light guiding part 7 of the above embodiment, when the bonding head 8 is positioned at the bonding position, the opening part 34a of the light receiving part 24 provided in the bonding head 8 is configured to be at a position that is in the vicinity of the irradiation opening 22a of the irradiation barrel 22. Thereby, the laser beam L emitted from the irradiation barrel 22 is prevented from leaking outside so that the safety of the operator is secured.

Additionally, the light guiding part 7, which is described in the above embodiment(s), guides the laser beam L emitted from the laser oscillator 6 to the irradiation barrel 22 by the optical fiber 21. However, another structure may be practical in which the laser beam L is guided by assembling multiple reflection mirrors instead of using the optical fiber.

What is claimed is:

1. A bonding device, comprising:
   a laser oscillator that oscillates laser beam;
   a light guiding part that guides the laser beam oscillated from the laser oscillator;
   a bonding head that sucks and holds a chip at a supply position where the chip is supplied, and that bonds the chip to a substrate by heating the chip with the laser beam guided by the light guiding part at a bonding position where the chip contacts to the substrate; and
   a bonding head moving part that moves the bonding head between the supply position and the bonding position, wherein
   the laser oscillator is separated from the bonding head, the light guiding part is configured with
      an irradiation barrel that is provided in the vicinity of the bonding position and irradiates the laser beam oscillated from the laser oscillator from an irradiation opening disposed at a front end thereof,
      a shutter part that is provided in the irradiation barrel and openably and closably configured to intercept the laser beam,
      a light receiving part that is provided in the bonding head, comprises an opening part that is an opening facing the irradiation barrel, and guides the laser beam entered from the opening part to the chip,
      when the bonding head moving part moves the bonding head to the bonding position, one of the irradiation opening of the irradiation barrel and the opening part of the light receiving part approaches the other in order to become close, the shutter part is opened at the status so that the laser beam from the irradiation barrel is guided to the bonding head through the opening part of the light receiving part.

2. The bonding device of claim 1, further comprising:
   a condensing lens that is disposed at a rearward of the irradiation opening in the irradiation barrel, wherein
   a focal point of the laser beam condensed by the condensing lens is positioned inside the light receiving part, and
   the shutter part is disposed at a rearward of the condensing lens.

* * * * *